(12) United States Patent
Toyao et al.

(10) Patent No.: US 9,000,306 B2
(45) Date of Patent: Apr. 7, 2015

(54) INTERCONNECT BOARD AND ELECTRONIC APPARATUS

(75) Inventors: Hiroshi Toyao, Tokyo (JP); Manabu Kusumoto, Tokyo (JP); Naoki Kobayashi, Tokyo (JP); Noriaki Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 237 days.

(21) Appl. No.: 13/701,010

(22) PCT Filed: Jun. 2, 2011

(86) PCT No.: PCT/JP2011/003108
§ 371 (c)(1),
(2), (4) Date: Nov. 29, 2012

(87) PCT Pub. No.: WO2011/152054
PCT Pub. Date: Dec. 8, 2011

(65) Prior Publication Data
US 2013/0068515 A1 Mar. 21, 2013

(30) Foreign Application Priority Data
Jun. 2, 2010 (JP) ................................. 2010-127189

(51) Int. Cl.
H05K 1/11 (2006.01)
H05K 1/02 (2006.01)

(52) U.S. Cl.
CPC ............ *H05K 1/0236* (2013.01); *H05K 1/0224* (2013.01)

(58) Field of Classification Search
CPC . H05K 1/0236; H05K 1/0224; H05K 1/0225; H05K 1/0227
USPC .......... 174/260, 261, 262; 361/760, 777, 784, 361/789, 792, 794, 803, 816, 818
See application file for complete search history.

(56) References Cited

U.S. PATENT DOCUMENTS 6,262,495 B1 7/2001 Yablonovitch et al.
6,995,985 B2 * 2/2006 Wu et al. ........................ 361/780
(Continued)

FOREIGN PATENT DOCUMENTS

JP 07-263871 A 10/1995
JP 11-261238 A 9/1999
(Continued)

OTHER PUBLICATIONS

International Search Report in PCT/JP2011/003108 dated Aug. 2, 2011(English Translation Thereof).
Japanese Office Action dated Nov. 18, 2014 with a partial English translation thereof.

*Primary Examiner* — Jinhee Lee
*Assistant Examiner* — Keith Depew
(74) *Attorney, Agent, or Firm* — McGinn Intellectual Property Law Group, PLLC

(57) ABSTRACT

An electronic apparatus (100) has an electronic device (151), a power supply plane (121) and a power supply plane (122) disposed with a gap (123) therebetween, a connection member (152) that electrically connects the power supply plane (122) and the electronic device (151), a ground plane (141) facing the power supply plane (121) or the power supply plane (122), a connection member (153) that electrically connects the ground plane (141) and the electronic device (151), a plurality of conductor elements (131) that is repeatedly arrayed, and open stubs (111) formed at a location overlapping the gap (123) included in an area surrounded by the conductor elements (131). In addition, at least some of the open stubs (111) face the power supply plane (122) which is not in contact with the open stubs (111).

20 Claims, 14 Drawing Sheets

(56) References Cited

U.S. PATENT DOCUMENTS

| | | | |
|---|---|---|---|
| 2008/0037237 A1* | 2/2008 | Chao et al. | 361/794 |
| 2010/0265159 A1* | 10/2010 | Ando et al. | 343/913 |
| 2012/0032865 A1* | 2/2012 | Toyao et al. | 343/835 |
| 2012/0325537 A1* | 12/2012 | Toyao et al. | 174/260 |
| 2013/0003333 A1* | 1/2013 | Toyao et al. | 361/777 |
| 2013/0126225 A1* | 5/2013 | Toyao | 174/262 |
| 2013/0293323 A1* | 11/2013 | Nakase | 333/236 |

FOREIGN PATENT DOCUMENTS

| | | |
|---|---|---|
| JP | 2000-183541 A | 6/2000 |
| JP | 2006-253929 A | 9/2006 |
| JP | 2009-252919 A | 10/2009 |
| JP | 2010-021468 A | 1/2010 |
| JP | 2010-062180 A | 3/2010 |

* cited by examiner (A)

(B)

(A)

(B)

(C)

INTERCONNECT BOARD AND ELECTRONIC APPARATUS

TECHNICAL FIELD

The present invention relates to a interconnect board and an electronic apparatus.

BACKGROUND ART

In an electronic apparatus, there are cases in which noise generated from electronic devices propagates through a parallel plate including a power supply and a ground plane that serves as a kind of waveguide so as to adversely affect other electronic devices or adjacent wireless circuits and the like. Therefore, in electronic apparatuses, it is normal to implement noise countermeasures, and a number of techniques have been developed.

In recent years, it has become evident that the propagation characteristics of electromagnetic waves can be controlled by disposing conductor patterns having a specific structure periodically (hereinafter described as a metamaterial). Particularly, a metamaterial configured to control electromagnetic wave propagation in a specific frequency zone is referred to as an electromagnetic band gap structure (hereinafter described as an EBG structure), and noise countermeasures using the EBG structure are attracting attention.

Examples of such techniques include a technique described in Patent Document 1 (specification of U.S. Pat. No. 6,262,495). FIG. 2 in Patent Document 1 shows a so-called mushroom-type EBG structure in which a plurality of island-shaped conductor elements are disposed above a sheet-like conductor plane, and each of the island-shaped conductor elements are connected to the conductor plane through a via hole.

In addition, Patent Document 2 (Japanese Unexamined Patent Application Publication No. 2006-253929) discloses an EBS structure in which an intermediate layer having an inductance element such as a spiral inductor disposed between a patch layer and a conductor plane layer is provided, and the patch, the inductance element, and the conductor plane are connected through a via hole in FIG. 12. The above structure enhances the inductance component without enlarging the EBG structure so as to match the band gap zone to a low-frequency zone.

RELATED DOCUMENTS

Patent Documents

[Patent Document 1] U.S. Pat. No. 6,262,495
[Patent Document 2] Japanese Unexamined Patent Application Publication No. 2006-253929

DISCLOSURE OF THE INVENTION

In a case in which a plurality of conductors are formed on a conductor layer with gaps therebetween in an electronic apparatus having a multilayer substrate, when an electronic device is connected to the conductor, a noise that has propagated through the conductor is radiated from the gaps, and the noise leaks outside other layers or the multilayer substrate. Therefore, it was not possible to obtain a sufficient noise countermeasure even when the EBG structure is configured in the conductor layer.

The invention has been made in light of the above circumstances, and an object of the invention is to provide a interconnect board and an electronic apparatus which have a plurality of divided conductors and prevent leakage of noises irradiated from gaps between the conductors.

According to the invention, there is provided a interconnect board including a plurality of first conductors that are located on a first layer and are disposed with a gap therebetween, a first connection member that connects at least one of the plurality of first conductors to an electronic device, a second conductor that is located on a second layer and faces the plurality of first conductors, a second connection member that connects the second conductor with the electronic device, a plurality of third conductors that are repeatedly arrayed so as to surround an area including the connection point of the first connection member and the first conductors or the connection point of the second connection member and the second conductor and at least some of the gap in a planar view, and fourth linear conductors that are formed in the gap included in the area, and of which one ends are connected to one of the first conductors and the other ends are open ends, wherein at least some of the fourth conductors face the first conductors which are not in contact with the fourth conductors.

In addition, according to the invention, there is provided an electronic apparatus including an electronic device, a plurality of first conductors that are located on a first layer and are disposed with a gap therebetween, a first connection member that connects at least one of the plurality of first conductors with an electronic device, a second conductor that is located on a second layer and faces the plurality of first conductors, a second connection member that connects the second conductor with the electronic device, a plurality of third conductors that is repeatedly arrayed so as to surround an area including a connection point of the first connection member and the first conductors or a connection point of the second connection member and the second conductor and at least some of the gap in a planar view, and fourth linear conductors that are formed at locations in which the fourth linear conductors overlap the gap included in the area in a planar view, and of which one ends are connected to one of the first conductors and the other ends are open ends, wherein at least some of the fourth conductors face the first conductors which are not in contact with the fourth conductors.

According to the invention, a interconnect board and an electronic apparatus which have a plurality of divided conductors and prevent leakage of noise radiated from gaps between the conductors are provided.

BRIEF DESCRIPTION OF THE DRAWINGS

The above object, other objects, characteristics, and advantages will be further clarified using the following preferable embodiments and the following accompanying drawings.

DESCRIPTION OF EMBODIMENTS

Figure 1:
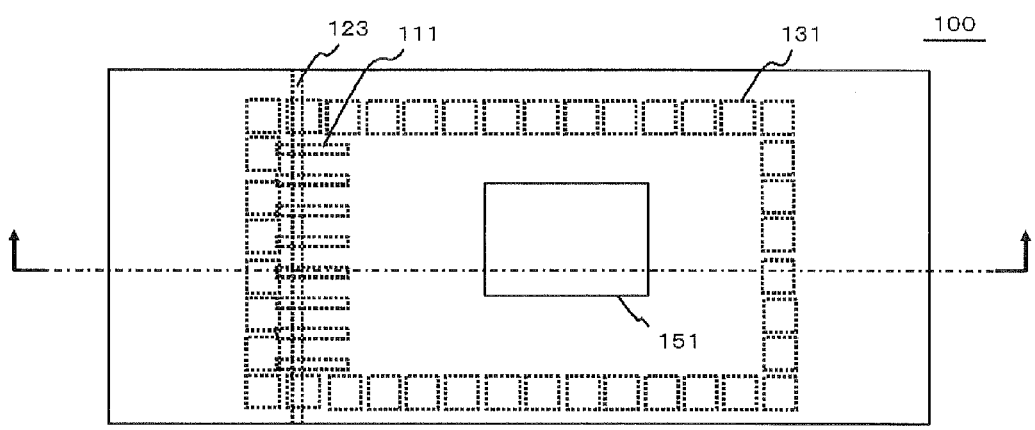
FIG. 1 shows a top view and a cross-sectional view of an electronic apparatus according to a first embodiment of the invention.
Figure 1:
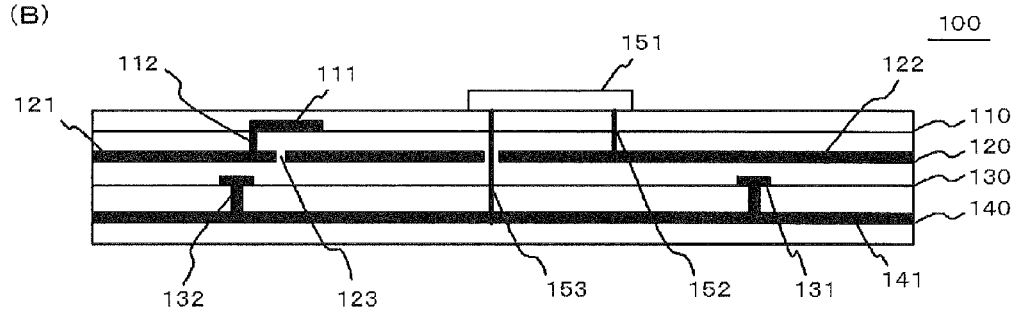

Hereinafter, embodiments of the present invention will be described using the accompanying drawings. Through the drawings, the same reference numerals are given to the same constituent elements and the description thereof will not be repeated.

First Embodiment

FIG. 1 shows a top view and a cross-sectional view of an electronic apparatus 100 according to a first embodiment of the invention. More specifically, FIG. 1A is a top view of the electronic apparatus 100, and FIG. 1B is a cross-sectional view of the electronic apparatus 100 at the cross-sectional line shown in FIG. 1A. The electronic apparatus 100 is a multi-layer substrate having at least an A layer 110, a B layer 120, a C layer 130, and a D layer 140 sequentially from the top surface.

Meanwhile, the electronic apparatus 100 may have layers other than the above four layers. For example, the electronic apparatus may have dielectric layers located between the respective layers. In addition, the electronic apparatus 100 may further have holes or via holes, not shown, within the scope of the configuration of the invention. Furthermore, signal wires may be arrayed in the four layers within the scope of the configuration of the invention.

The electronic apparatus 100 has an electronic device 151, a power supply plane 121 (first conductor), a power supply plane 122 (first conductor), a ground plane 141 (second conductor), open stubs 111 (fourth conductors), and conductor elements 131 (third conductors).

The electronic device 151 is mounted on the top surface of the electronic apparatus 100. The electronic device 151 is connected to the power supply plane 122 through a connection member 152, and is connected to a ground plane 141 through a connection member 153. Meanwhile, the electronic device 151 is assumed to be an element such as an LSI. The number of the electronic devices 151 mounted in the electronic apparatus 100 may be singular or plural. In the embodiment, the electronic device 151 mounted on the top surface of the electronic apparatus 100 will be described, but the embodiment is not necessarily limited thereto, and the electronic device may be mounted inside.

The power supply plane 121 and the power supply plane 122 are located on the B layer 120, and are disposed with a gap 123 therebetween. In addition, the power supply plane 122 is connected to the electronic device 151 through the connection member 152 (first connection member).

The ground plane 141 is located on the D layer 140, and faces the power supply plane 121 and the power supply plane 122. In addition, the ground plane 141 is connected to the electronic device 151 through the connection member 153 (second connection member).

The conductor elements 131 are repeatedly arrayed so as to surround an area including the connection point of the power supply plane 122 and the connection member 152, the connection point of the ground plane 141 and the connection member 153, and at least some of the gap 123 in a planar view. Meanwhile, the drawing shows that the area surrounded by the conductor elements 131 includes the connection point between the power supply plane 122 and the connection member 152 and the connection point of the ground plane 141 and the connection member 153 in the embodiment, but the embodiment is not necessarily limited thereto, and the area may include at least one of both.

The open stubs 111 are located on the A layer 110 which is a layer on the B layer 120, and are formed at locations overlapping the gap 123 included in the area in a planar view. The open stub 111 is a linear conductor, is connected to the power supply plane 121 through a via hole 112 at one end, and forms an open end at the other end.

Hereinafter, the respective components will be described in detail using the respective drawings.

Figure 2:
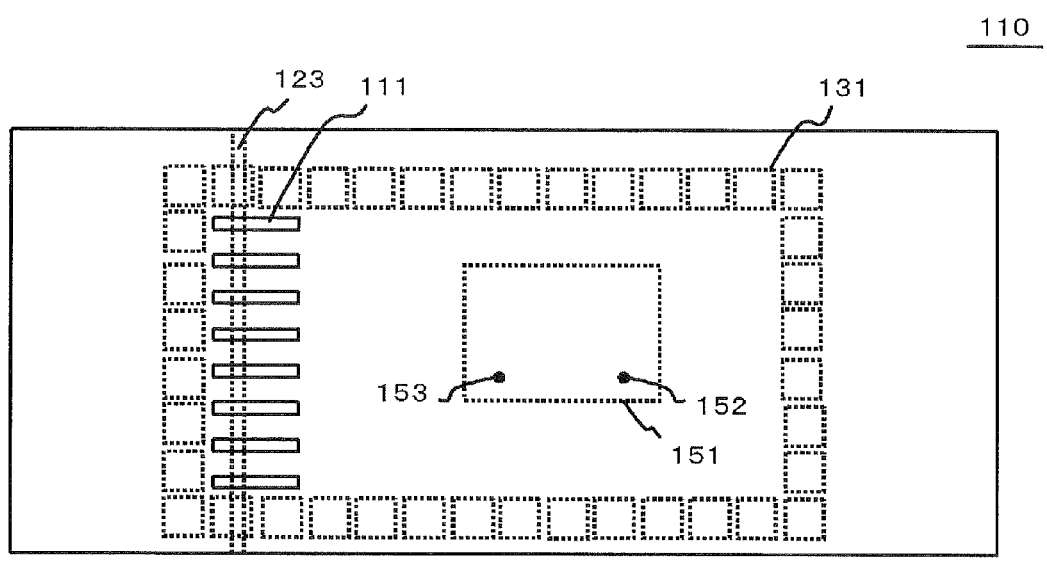
FIG. 2 is a view showing an A layer in the electronic apparatus of the first embodiment.

FIG. 2 is a view showing the A layer 110 in the electronic apparatus 100 of the first embodiment. The plurality of open stubs 111 is repeatedly arrayed on the A layer 110. The respective open stubs 111, the connection member 152, and the connection member 153 are mutually insulated.

The open stub 111 is a linear conductor located on the A layer 110, the shape thereof is not limited to be straight, and may be, for example, swirling, meandering, or the like.

In the embodiment, the plurality of open stubs 111 are repeatedly arrayed, and at least some of the respective open stubs 111 face the power supply plane 122, but the embodiment is not necessarily limited thereto. For example, there may be a case in which a single open stub 111 is provided. In addition, the open stubs 111 that are connected to the power supply plane 122 and face the power supply plane 121 may be present among the open stubs.

Here, the open stubs 111 being repeatedly arrayed means that at least three open stubs 111 are continuously arrayed with gaps therebetween.

Figure 3:
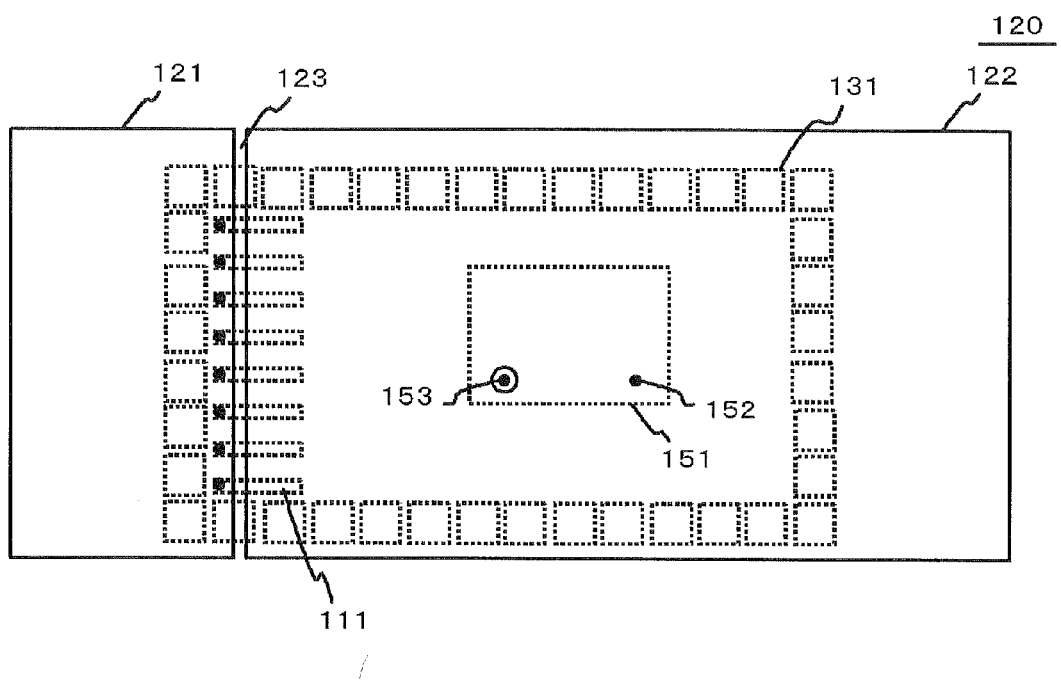
FIG. 3 is a view showing a B layer in the electronic apparatus of the first embodiment.

FIG. 3 is a view showing the B layer 120 in the electronic apparatus 100 of the first embodiment. The B layer 120 is a sheet-like conductor on which the power supply plane 121 and the power supply plane 122 are arrayed with the gap 123 therebetween.

The gap 123 is filled with a dielectric body, and the power supply plane 121 and the power supply plane 122 are mutually insulated. Therefore, it is possible to supply different potentials to the power supply plane 121 and the power supply plane 122. However, the potentials do not necessarily need to be all different, and may be mutually the same.

The power supply plane 122 has a connection point connected to the connection member 152, and supplies power to the electronic device 151. In addition, the power supply plane 122 has an opening through which the connection member 153 passes, and the power supply plane 122 and the connection member 153 are mutually insulated.

Meanwhile, the power supply plane 121 may supply power to the electronic device 151 using wires, not shown, and may supply power to other elements and the like, not shown.

Figure 4:
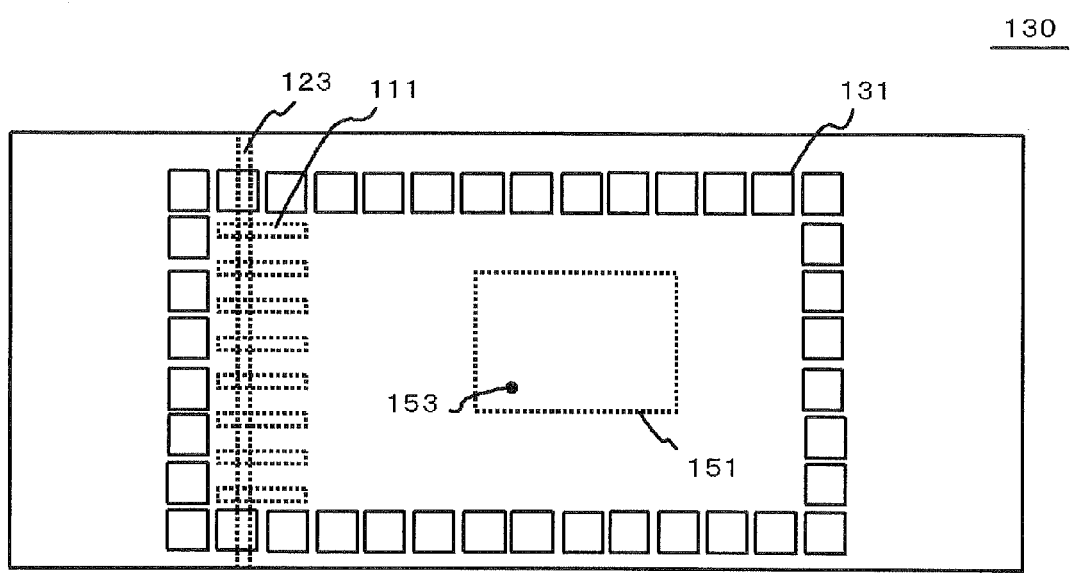
FIG. 4 is a view showing a C layer in the electronic apparatus of the first embodiment.

FIG. 4 is a view showing the C layer 130 in the electronic apparatus 100 of the first embodiment. A plurality of conductor element 131 are repeatedly arrayed on the C layer 130 so as to surround at least some of an area facing the connection point of the connection member 153 and the plurality of open stubs 111. Meanwhile, in the embodiment, the conductor elements 131 are located on the C layer 130 between the B layer 120 (first layer) and the D layer 140 (second layer). In addition, each of the conductor elements 131 is insulated from the connection member 153.

The conductor element 131 is an island-shaped conductor, but the shape thereof is not limited to be rectangular. Plural kinds of shapes of the conductor element 131 can be considered to be applicable to the electronic apparatus 100 of the embodiment, and the shapes will be described below.

The conductor elements 131 face the power supply plane 121 or the power supply plane 122, and furthermore face the ground plane 141. In addition, the conductor elements 131 are connected to the facing ground plane 141 through the connection member 132 (third connection member).

Here, the conductor elements 131 being repeatedly arrayed means that at least three conductor elements 131 are continuously arrayed with gaps therebetween.

Figure 5:
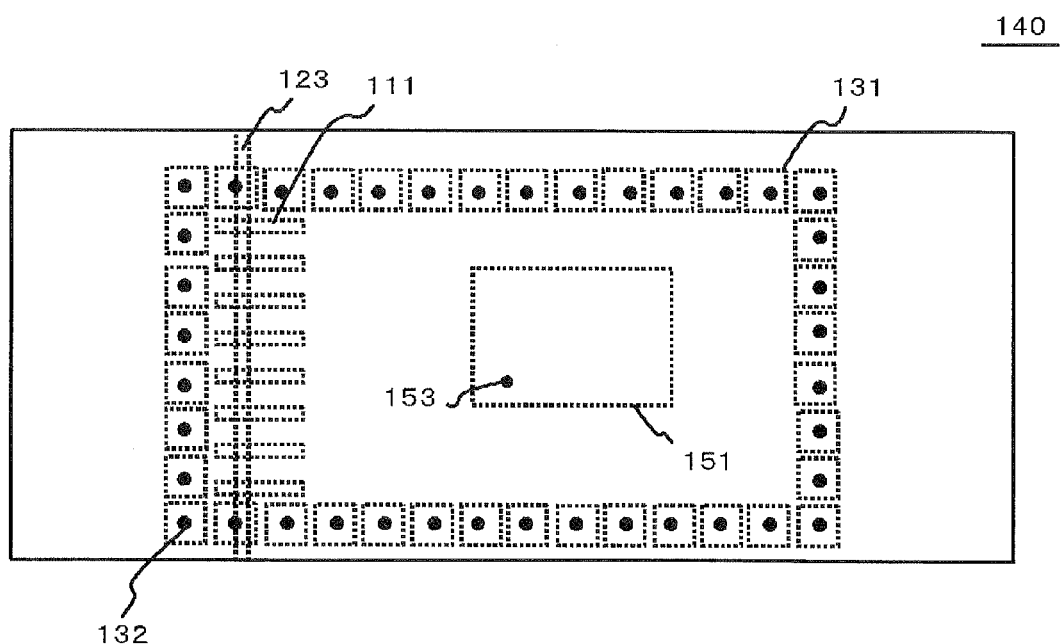
FIG. 5 is a view showing a D layer in the electronic apparatus of the first embodiment.

FIG. 5 is a view showing the D layer 140 in the electronic apparatus 100 of the first embodiment. The ground plane 141 extends to the D layer 140. The ground plane 141 is a sheet-like conductor to which the basic potential is supplied through grounding or the like.

The ground plane 141 has a connection point with the connection member 153.

In the electronic apparatus 100 of the embodiment, a parallel plate including the ground plane 141 and the power supply plane 121 (or 122) can be considered to be the propagation path of noise that propagates from the electronic device 151.

In the above configuration, the respective conductor elements 131 compose unit cells of an EBG structure including the facing ground plane 141 and the facing power supply plane 121 (or 122).

Here, the unit cell refers to a minimum unit that composes the EBG structure, and, when the electronic apparatus 100 includes the repeatedly arrayed unit cells, it is possible to effectively suppress noises propagating from the electronic device 151 through the connection member 152 (or 153).

FIG. 6A is a top view of an example of the conductor element 131. The conductor element 131 shown in FIG. 6A is a rectangular conductor, and the unit cell including the conductor element 131 having the above shape is termed a so-called mushroom-type EBG structure.

More specifically, the conductor elements 131 correspond to the head portion of the mushroom, and form a capacitance between the respective facing power supply planes 121 (or 122). Meanwhile, the connection member 132 corresponds to the axis portion of the mushroom, and forms an inductance.

The mushroom-type EBG structure can be expressed using an equivalent circuit in which the parallel plate is shunted using a serial resonance circuit including the capacitance and the inductance, and the resonance frequency of the serial resonance circuit supplies the central frequency of the band gap. Therefore, it is possible to move the band gap zone to a lower frequency by bringing the conductor elements 131 close to the respective facing planes that form the capacitance so as to increase the capacitance. However, even in a case in which the conductor elements 131 are not brought close to the facing plane, the essential effects of the invention are not influenced.

FIG. 6B is a top view of an example of the conductor element 131. The conductor element 131 shown in FIG. 6B is a spiral transmission line formed in a plane direction, and has an end connected to the connection member 132 connected to the ground plane 141 and the other end forming an open end. The unit cell including the conductor element 131 having the above shape has an open stub-type EBG structure in which a microstrip line formed including the conductor element 131 functions as an open stub.

More specifically, the conductor elements 131 are electrically bonded with the respective facing power supply plane 121 (or 122) so as to form a microstrip line using the power supply plane 121 (or 122) as a return path. Meanwhile, the connection member 132 forms an inductance. One end of the microstrip line forms an open end, and is configured to function as an open stub.

The open stub-type EBG structure can be expressed using an equivalent circuit in which the parallel plate is shunted using a serial resonance circuit including the open stub and the inductance, and the resonance frequency of the serial resonance circuit supplies the central frequency of the band gap. Therefore, it is possible to move the band gap zone to a lower frequency by increasing the stub length of the open stub formed including the conductor elements 131.

Meanwhile, the conductor elements 131 forming the microstrip line and the facing power supply plane 121 (or 122) are preferably located close to each other. This is because, as the distance between the conductor element 131 and the facing plane decreases, the characteristic impedance of the microstrip line decreases, and it is possible to widen the band gap zone. However, even in a case in which the conductor element 131 is not brought close to the facing plane, the essential effects of the invention are not influenced.

FIG. 6C is a top view of an example of the conductor element 131. The conductor element 131 shown in FIG. 6C is a rectangular conductor, and has an opening. In the opening, a spiral inductor that is connected to the edge of the opening at one end and is connected to the connection member 132 connected to the ground plane 141 at the other end is formed. The unit cell including the conductor element 131 having the above shape has an inductance enhancement-type EBG structure in which an inductor is provided to the mushroom-type EBG structure at the head portion of the mushroom so as to increase the inductance.

More specifically, the conductor element 131 corresponds to the head portion of the mushroom, and a capacitance is formed between the respective facing power supply planes 121 (or 122). Meanwhile, the connection member 132 corresponds to the axis portion of the mushroom, and forms an inductance with the inductance provided in the conductor element 131.

The inductance enhancement-type EBG structure can be expressed using an equivalent circuit in which the parallel plate is shunted using a serial resonance circuit including the capacitance and the inductance, and the resonance frequency of the serial resonance circuit supplies the central frequency of the band gap. Therefore, it is possible to move the band gap zone to a lower frequency by bringing the conductor elements 131 close to the respective power supply planes 121 (or 122) that form the capacitance so as to increase the capacitance, or increasing the length of the inductor so as to enhance the inductance. However, even in a case in which the conductor elements 131 are not brought close to the facing plane, the essential effects of the invention are not influenced.

In addition, in the electronic apparatus 100 of the embodiment, the plurality of open stubs 111 is formed in the gap 123. Since the respective open stubs 111 cause electrical shortcircuits with the facing power supply plane 122, it appears that the gap 123 having the open stubs 111 formed therein is closed in a specific frequency zone. Therefore, it is possible to prevent noise in the frequency zone from leaking from the gap 123.

Meanwhile, the noise is electromagnetic waves leaked from the electronic device 151. However, not all of the electromagnetic waves function as noise, and, more frequently, some of the electromagnetic waves function as noise. The wavelength of electromagnetic waves that function as noise among the leaked electromagnetic waves is changed by an element which needs to be free from the influence of the noise. Here, when the frequency of an electromagnetic wave leaked from the electronic device 151 is indicated by f, the length of the open stub 111, the length d of the portion of the open stub 111 facing the power supply plane 122 is accurately specified as the following formula (I).

However, $\epsilon_{\mathit{eff}}$ represents the effective relative permittivity in the plurality of open stubs 111. In addition, $\epsilon_0$ represents the permittivity of the vacuum. In addition, $\mu_0$ represents the permeability of the vacuum. Furthermore, $\lambda$ represents the wavelength of the electromagnetic wave.

[Formula 1]

$$d = \frac{1}{4f\sqrt{\varepsilon_{\mathit{eff}}\varepsilon_0\mu_0}} = \frac{\lambda}{4} \quad (1)$$

That is, the most preferable length d of the open stub 111 is one fourth of the wavelength $\lambda$ at which the electromagnetic waves leaked from the electronic device 151 become noise, and the open stub 111 is most likely to be short-circuited.

However, the length d of the open stub 111 may be more than or equal to one eighth to less than or equal to three eighths of the wavelength $\lambda$ of noise generated from the electronic device 151 in practical use.

Meanwhile, the noise generated from the electronic device 151 refers to, for example, a high frequency component with a clock frequency which is used for the electronic device 151. However, the frequency of the noise is not necessarily limited thereto. For example, in a case in which an RF circuit or the like which is weakly resistant to noise is mounted near the electronic device 151 which serves as a noise source, it is preferable to suppress noise having the same frequency as the operation frequency of the RF circuit among noise generated from the electronic device 151.

Therefore, the electronic apparatus 100 of the embodiment has the EBG structure including the conductor elements 131 and the open stubs 111, and therefore it is possible to confine noise in the area surrounded by the unit cells, and to prevent noise from propagating outside.

Meanwhile, in the EBG structure including the conductor elements 131, the frequency of noises generated from the electronic device 151 is desirably included in the band gap zone.

The band gap zone of the EBG structure including the conductor elements 131 can be specified to a desired value by adjusting the interval between the conductor elements 131 and the power supply plane 121 (or 122), the interval between the conductor elements 131 and the ground plane 141, the size of the connection member 132, the mutual interval of the conductor elements 131, and the like.

In addition, the repeatedly arrayed unit cells are desirably arrayed periodically. This is because, in a case in which the unit cells are periodically disposed, electromagnetic waves propagating through the EBG structure induce Bragg reflections caused by the periodicity, and therefore a wider noise propagation suppression effect can be obtained.

However, the unit cells do not necessarily need to be periodically disposed, and the effects of the invention can be obtained as long as the unit cells are repeatedly arrayed so as to surround the area in which the open stubs 111 are formed and the area in which the electronic device 151 is mounted.

Second Embodiment

Figure 7:
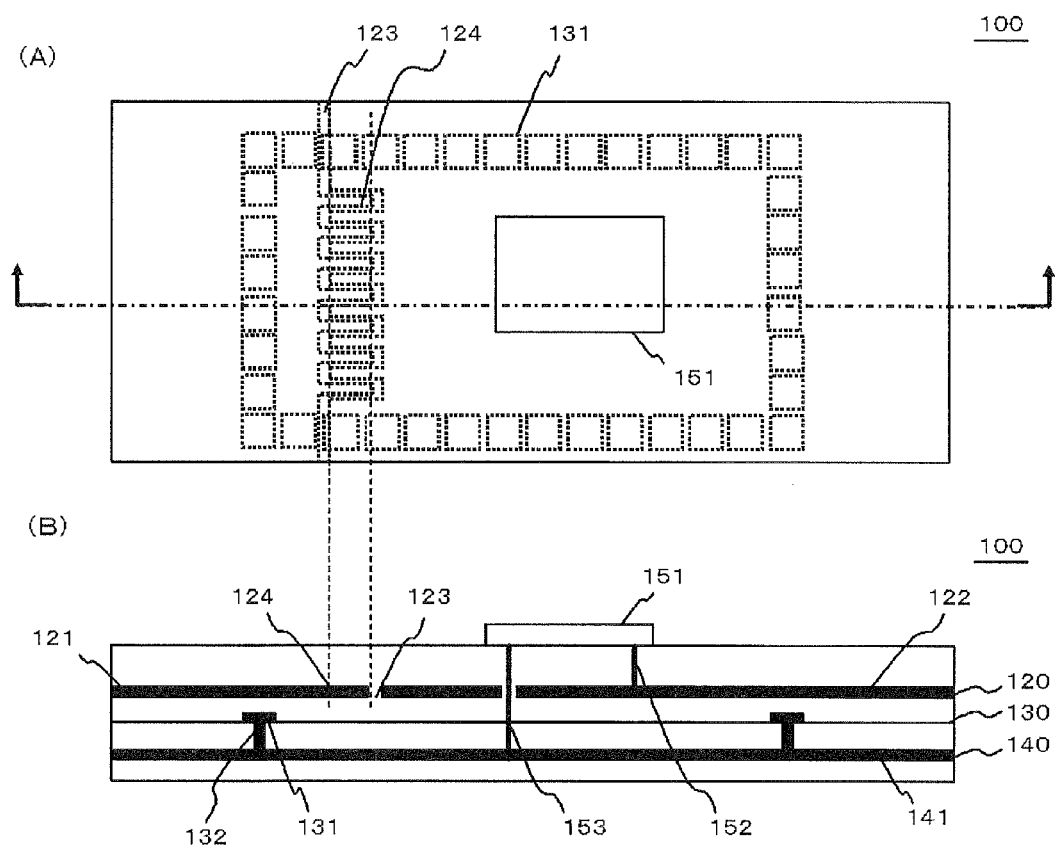
FIG. 7 shows a top view and a cross-sectional view of an electronic apparatus according to a second embodiment of the invention.

FIG. 7 shows a top view and a cross-sectional view of the electronic apparatus 100 according to a second embodiment of the invention. In more detail, FIG. 7A is a top view of the electronic apparatus 100, and FIG. 7B is a cross-sectional view of the electronic apparatus 100 at the cross-sectional line shown in FIG. 7A.

Compared to the electronic apparatus 100 of the first embodiment, the electronic apparatus 100 of the embodiment does not have the plurality of open stubs 111 and the A layer 110 on which the open stubs are located, and the difference is that, instead, a pectinate protrusion portion 124 is disposed at the gap 123 between the power supply plane 121 and the power supply plane 122. In other words, a plurality of recess portions are formed on a side facing the gap 123 in the power supply plane 122, and the protrusion portion 124 integrally formed with the power supply plane 121 is inserted into the respective plurality of recess portions.

Figure 8:
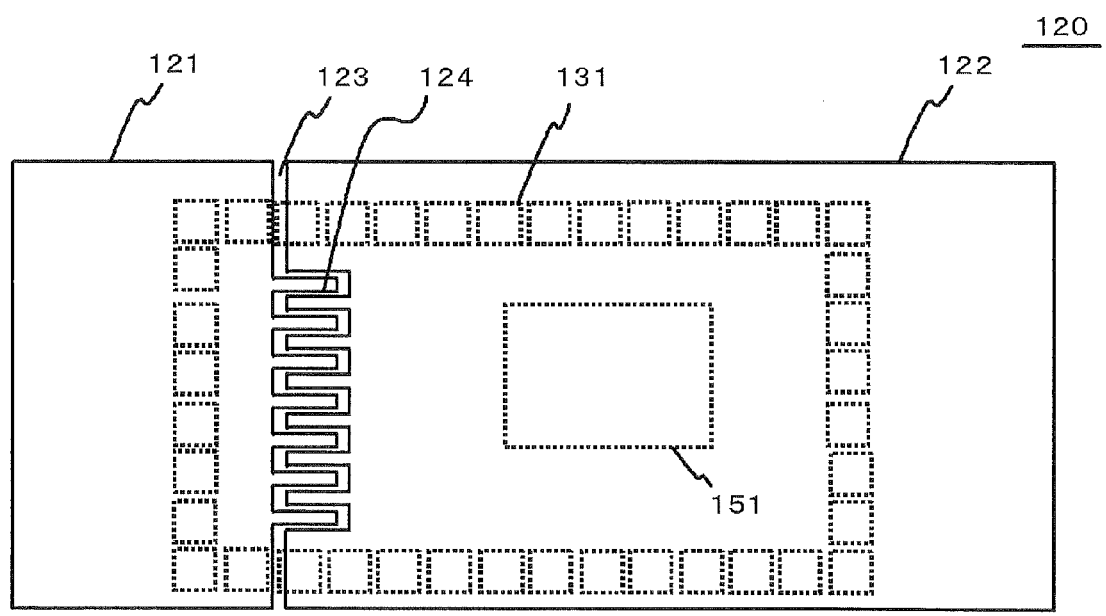
FIG. 8 is a view showing a B layer in the electronic apparatus of the second embodiment.

FIG. 8 is a view showing the B layer 120 in the electronic apparatus 100 of the second embodiment.

The respective parts of the protrusion portion 124 can be considered to be coplanar lines. The coplanar lines refer to a transmission line in which two conductors composing the transmission line, that is, a signal conductor and a plane conductor are present on the same plane. In the embodiment, the protrusion portion 124 corresponds to the "signal conductor." The respective parts of the protrusion portion 124 are connected to either plane of the power supply plane 121 and the power supply plane 122 at one end, and face the other plane, thereby forming the coplanar line. Since the other end of the protrusion portion 124 forms an open end, the respective parts of the protrusion portion 124 can be considered to be the same as the open stubs 111 of the first embodiment.

The C layer 130 and the D layer 140 are the same as in the first embodiment. Therefore, the structure of the area in which the conductor elements 131, the power supply plane 121 (or 122), and the ground plane 141 face each other is the same as in the first embodiment, and the EBG structure is also configured in the second embodiment.

Figure 6:
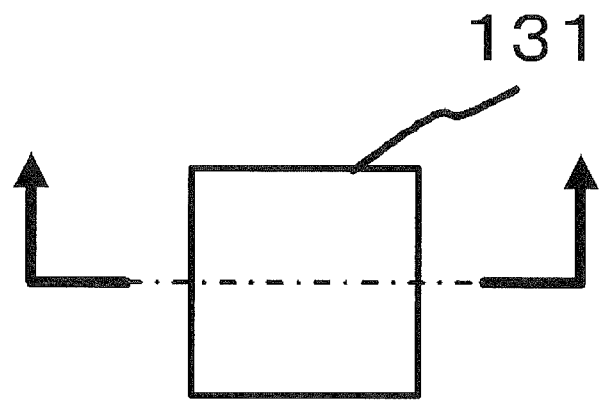
FIG. 6 shows top views of modified examples of a conductor element.
Figure 6:
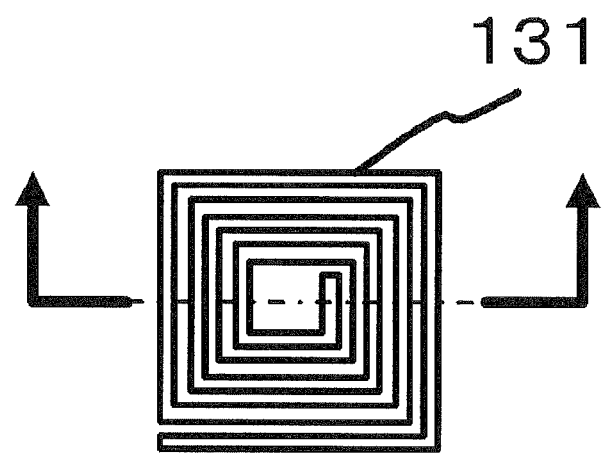
Figure 6:
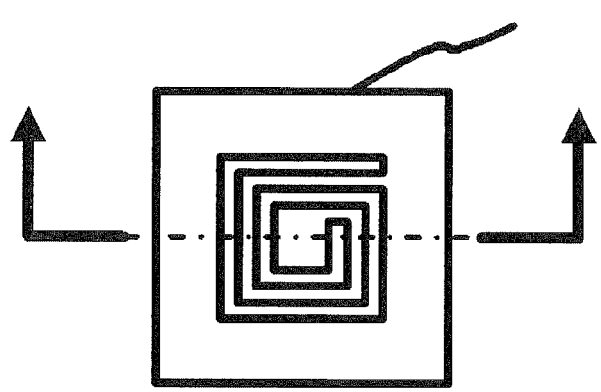

Meanwhile, any one of the shapes shown in FIG. 6 may be used for the conductor elements 131 of the second embodiment.

Figure 14:
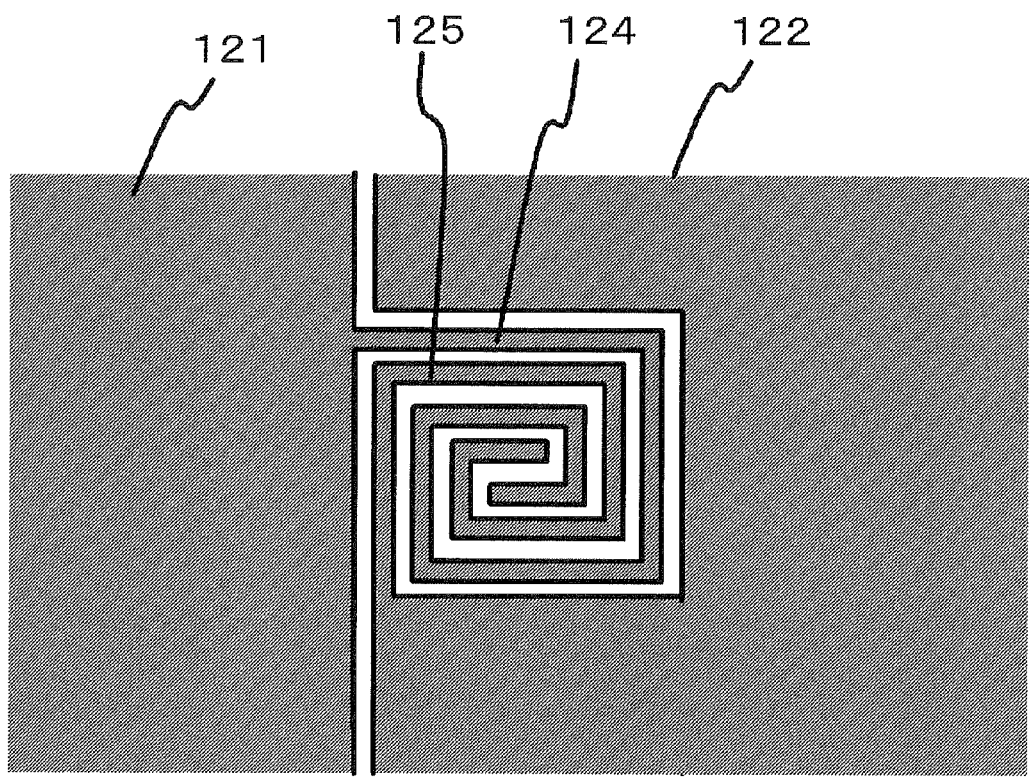
FIG. 14 is an enlarged view showing a modified example of the electronic apparatus of the second embodiment of the invention.

Therefore, similarly to the first embodiment, even in the electronic apparatus 100 of the second embodiment, it is possible to confine noise in the area surrounded by the unit cells, and to prevent noise from propagating outside. Meanwhile, in the embodiment, the protrusion portion 124 may extend in a spiral shape as shown in FIG. 14. In this case, a spiral protrusion portion 125 is also formed in the power supply plane 122. The protrusion portion 125 extends so as to engage with the protrusion portion 124.

Thus far, the embodiments of the invention have been described with reference to the drawings, but the embodiments are simply examples of the invention, and a variety of configurations other than the embodiments can be employed.

In the embodiments, the electronic apparatus 100 in which the electronic device 151 has already been mounted has been described. However, the invention is also applicable to a interconnect board for which a mounting-expected area in which the electronic device is to be mounted has been specified.

In the embodiments, the gap 123 and the electronic device 151 have been described using the drawings in which both are not overlapped in a planar view, the gap and the electronic device may be overlapped. In this case, a part of the power supply plane 121 and a part of the power supply plane 122 may be located immediately below the electronic device 151.

In the embodiments, the number of the power supply planes arrayed with the gap 123 therebetween is two, but three or more power supply planes may be divided. At this time, each of the three or more power supply planes can be considered to be the first conductor of the invention so as to configure the electronic apparatus or the interconnect board.

In the embodiments, the electronic device 151 is mounted on the plane (mounted on the top surface of the electronic apparatus 100), but may be mounted inside.

In the first embodiment, the open stubs 111 are described to locate on the layer above the power supply plane 121 or the power supply plane 122, but may be located on the layer between the power supply plane 121 or the power supply plane 122 and the ground plane 141.

Figure 9:
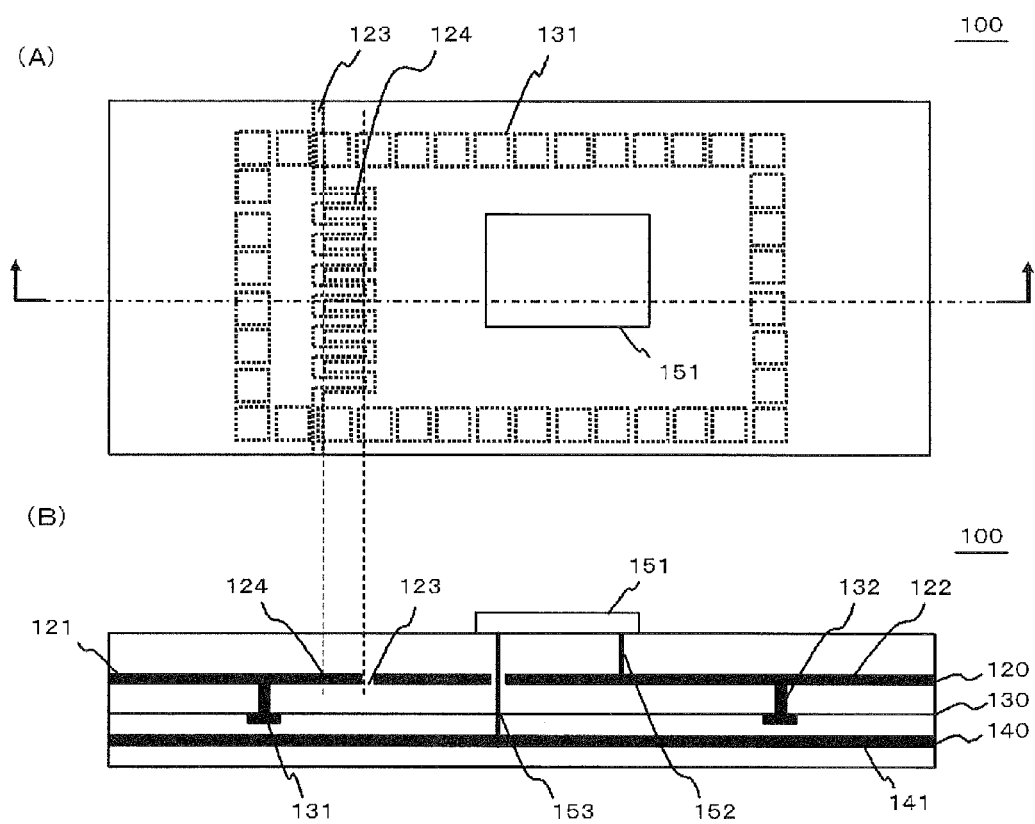
FIG. 9 shows a top view and a cross-sectional view of a modified example of the electronic apparatus according to the second embodiment of the invention.

FIG. 9 shows a top view and a cross-sectional view of a modified example of the electronic apparatus 100 according to the second embodiment of the invention. The electronic apparatus 100 is different from the electronic apparatus 100 of the second embodiment in that the conductor elements 131 are connected to the power supply plane 121 or the power supply plane 122 through the connection member 132.

The rest configuration or the effects are the same as in the second embodiment, and thus will not be described.

Figure 10:
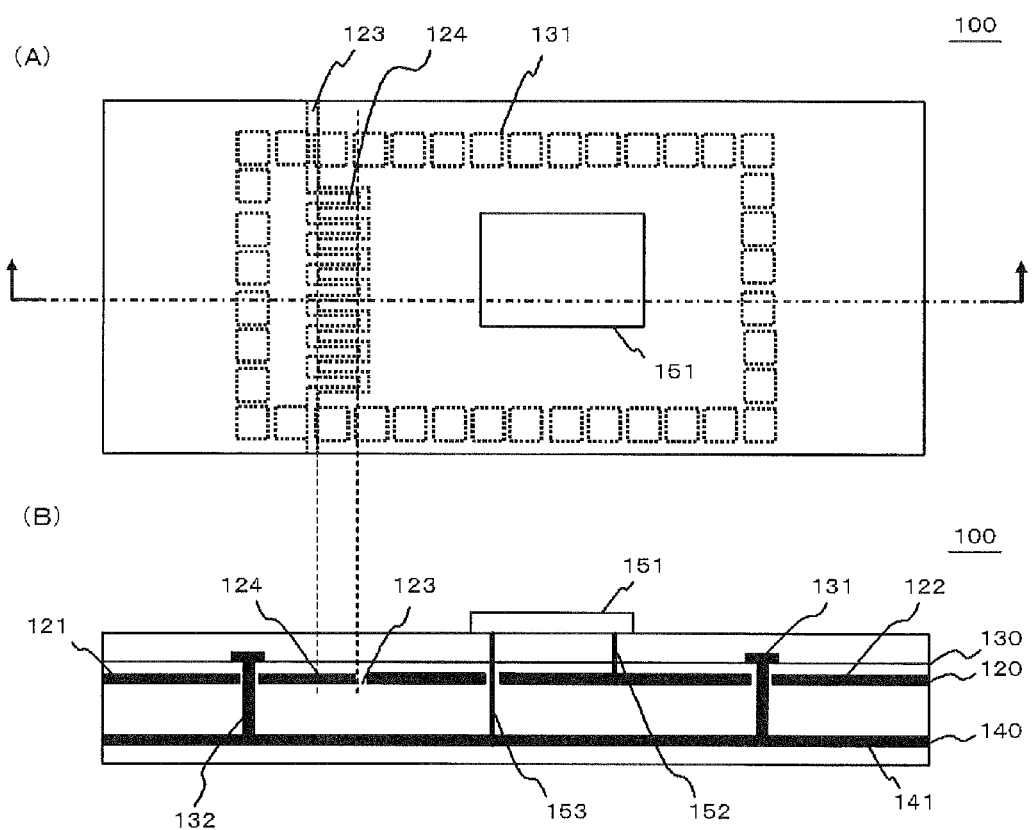
FIG. 10 shows a top view and a cross-sectional view of a modified example of the electronic apparatus according to the second embodiment of the invention.

FIG. 10 shows a top view and a cross-sectional view of a modified example of the electronic apparatus 100 according to the second embodiment of the invention. The electronic apparatus 100 is different from the electronic apparatus 100 of the second embodiment in that the conductor elements 131 face the ground plane 141 through the power supply plane 121 or the power supply plane 122, and are connected to the ground plane 141 through the connection member 132. In addition, the electronic apparatus 100 is different from the electronic apparatus 100 of the second embodiment in that the power supply plane 121 or the power supply plane 122 is provided with an opening through which the connection member passes.

Even in the above configuration, an EBG structure including a parallel plate including the power supply plane 121 (or 122) and the ground plane 141 and the conductor elements 131 can be configured. Therefore, the electronic apparatus 100 can also obtain the same effects as those of the second embodiment.

Meanwhile, in FIG. 10, the C layer 130 on which the conductor elements 131 are located is provided, but the conductor elements 131 may be located with the electronic device 151 on the same surface (the top surface in FIG. 10). In this case, since the C layer 130 does not need to be provided, there is a merit of being able to manufacture a thinner electronic apparatus 100.

Figure 11:
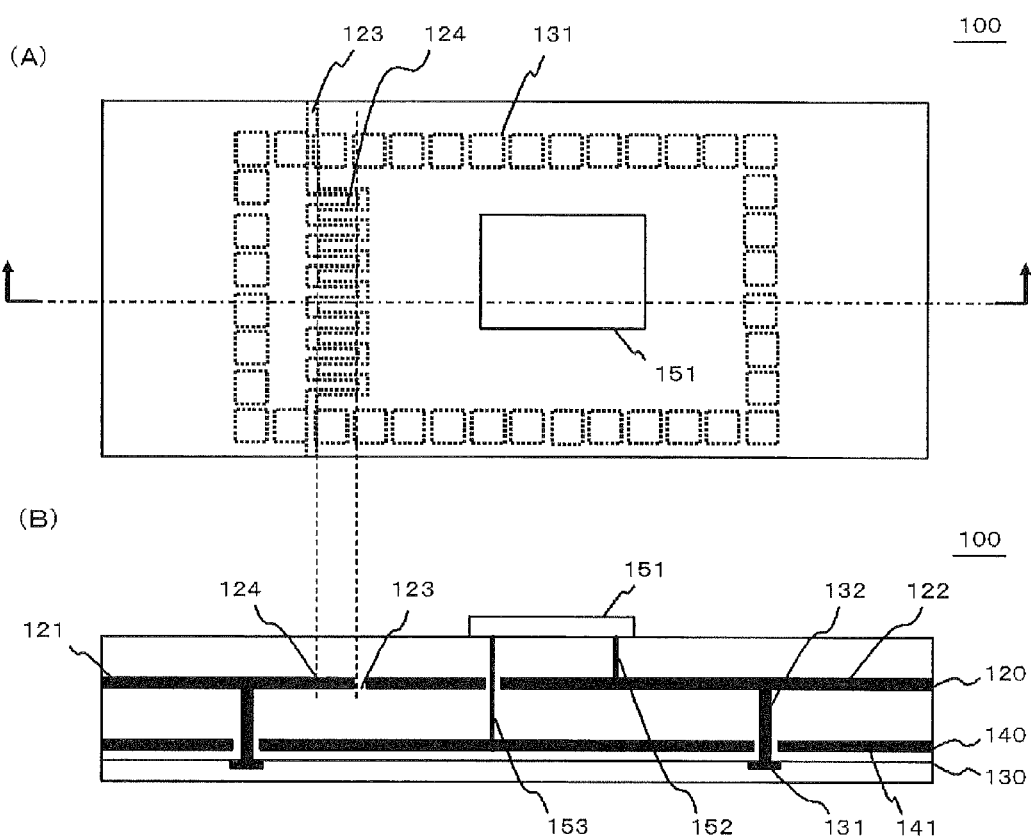
FIG. 11 shows a top view and a cross-sectional view of a modified example of the electronic apparatus according to the second embodiment of the invention.

FIG. 11 shows a top view and a cross-sectional view of a modified example of the electronic apparatus 100 according to the second embodiment of the invention. The electronic apparatus 100 is different from the electronic apparatus 100 of the second embodiment in that the conductor elements 131 face the power supply plane 121 or the power supply plane 122 through the ground plane 141, and are connected to the power supply plane 121 or the power supply plane 122 through the connection member 132. In addition, the electronic apparatus 100 is different from the electronic apparatus 100 of the second embodiment in that the ground plane 141 is provided with an opening through which the connection member passes.

Even in the above configuration, an EBG structure including a parallel plate including the power supply plane 121 (or 122) and the ground plane 141 and the conductor elements 131 can be configured. Therefore, the electronic apparatus 100 can also obtain the same effects as those of the second embodiment.

Meanwhile, in FIG. 11, the C layer 130 on which the conductor elements 131 are located is provided, but the conductor elements 131 may be located on the rear surface (the bottom surface in FIG. 11) on which the electronic device 151 is mounted. In this case, since the C layer 130 does not need to be provided, there is a merit of being able to manufacture a thinner electronic apparatus 100.

Figure 12:
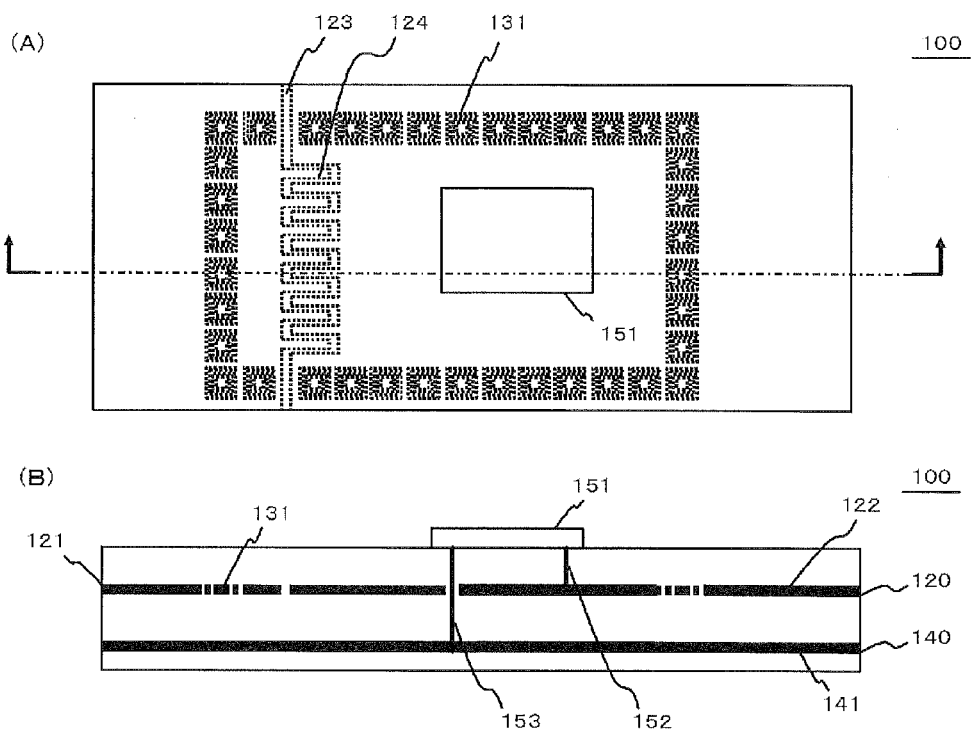
FIG. 12 shows a top view and a cross-sectional view of a modified example of the electronic apparatus according to the second embodiment of the invention.

FIG. 12 shows a top view and a cross-sectional view of a modified example of the electronic apparatus 100 according to the second embodiment of the invention. The electronic apparatus 100 is different from the electronic apparatus 100 of the second embodiment in that the conductor elements 131 are located on the B layer 120 (first layer), face the ground plane 141, and are connected to the power supply plane 121 or the power supply plane 122 through the inductor. In addition, among the shapes of the conductor element 131 shown in FIG. 6, the shape of the conductor element 131 which can be used for the electronic apparatus 100 is the shape shown in FIG. 6C.

Even in the above configuration, an EBG structure including a parallel plate including the power supply plane 121 (or 122) and the ground plane 141 and the conductor elements 131 can be configured. Therefore, the electronic apparatus 100 can also obtain the same effects as those of the second embodiment.

In addition, since the C layer 130 does not need to be provided, there is a merit of being able to manufacture a thinner electronic apparatus 100.

Figure 13:
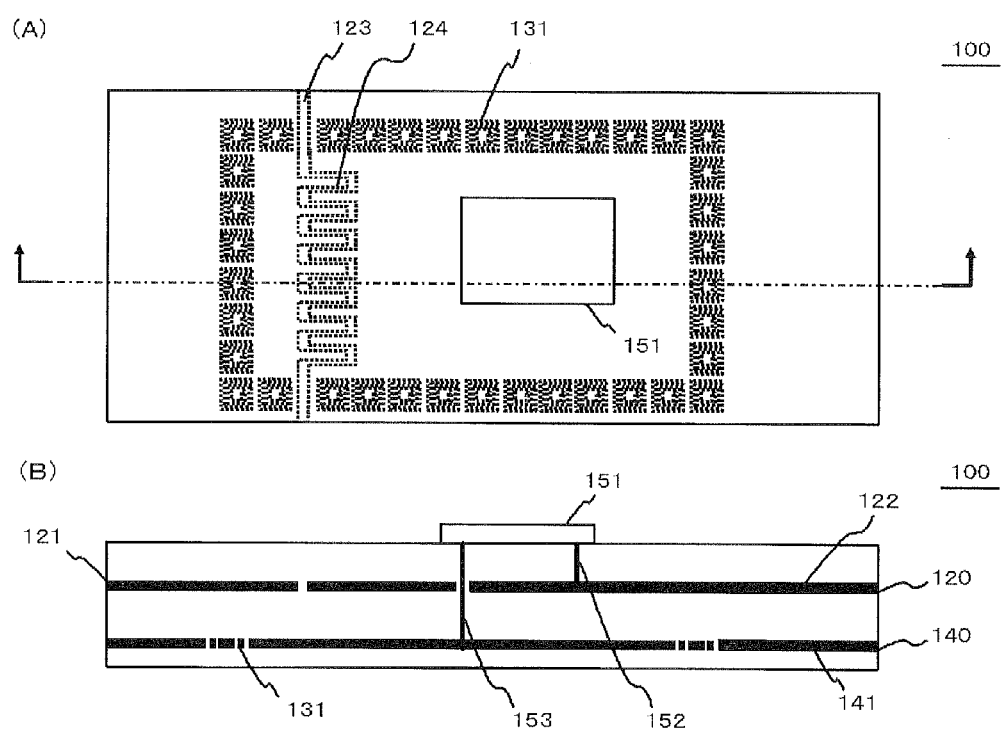
FIG. 13 shows a top view and a cross-sectional view of a modified example of the electronic apparatus according to the second embodiment of the invention.

FIG. 13 shows a top view and a cross-sectional view of a modified example of the electronic apparatus 100 according to the second embodiment of the invention. The electronic apparatus 100 is different from the electronic apparatus 100 of the second embodiment in that the conductor elements 131 are located on the D layer 140 (second layer), face the power supply plane 121 or the power supply plane 122, and are connected to the ground plane 141 through the inductor. In addition, among the shapes of the conductor element 131 shown in FIG. 6, the shape of the conductor element 131 which can be used for the electronic apparatus 100 is the shape shown in FIG. 6C.

Even in the above configuration, an EBG structure including a parallel plate including the power supply plane 121 (or 122) and the ground plane 141 and the conductor elements 131 can be configured. Therefore, the electronic apparatus 100 can also obtain the same effects as those of the second embodiment.

In addition, since the C layer 130 does not need to be provided, there is a merit of being able to manufacture a thinner electronic apparatus 100.

Meanwhile, needless to say, the above embodiments and the above plurality of modified examples can be combined within the scope of the contents of the invention. In addition, in the embodiments and the modified examples, the functions and the like of the respective components have been specifically described, but the functions and the like can be changed in various manners with the scope of the invention.

The present application claims priority based on Japanese Unexamined Patent Application Publication No. 2010-127189, filed on Jun. 2, 2010, the content of which is incorporated herein by reference.

The invention claimed is:

1. An interconnect board comprising:
a plurality of first conductors that are located on a first layer and are disposed with a gap therebetween;
a first connection member that connects at least one of the plurality of first conductors with an electronic device;
a second conductor that is located on a second layer and faces the plurality of first conductors;
a second connection member that connects the second conductor with the electronic device;
a plurality of third conductors that are repeatedly arrayed so as to surround an area including a connection point of the first connection member and the first conductors or a connection point of the second connection member and the second conductor and at least some of the gap in a planar view; and
fourth linear conductors that are formed at locations in which the fourth linear conductors overlap the gap included in the area in a planar view, and of which one ends are connected to one of the first conductors and the other ends are open ends,
wherein at least some of the fourth conductors face the first conductors which are not in contact with the fourth conductors.

2. The interconnect board according to claim 1, wherein a length of a portion of the fourth conductors which face the first conductors is more than or equal to one eighth to less than or equal to three eighths of a wavelength of electromagnetic waves leaked from the electronic device.

3. The interconnect board according to claim 2, wherein the plurality of fourth conductors are repeatedly arrayed.

4. The interconnect board according to claim 2, wherein the fourth conductors are located on a layer different from the first layer, and are connected to the first conductors through a connection member.

5. The interconnect board according to claim 2, wherein the fourth conductors are located on the first layer, and the fourth conductors connected to one of the first conductors and the fourth conductors connected to the other first conductors are alternately arrayed in the gap.

6. The interconnect board according to claim 2, wherein the length is one fourth of the wavelength.

7. The interconnect board according to claim 6, wherein the plurality of fourth conductors are repeatedly arrayed.

8. The interconnect board according to claim 6, wherein the fourth conductors are located on a layer different from the first layer, and are connected to the first conductors through a connection member.

9. The interconnect board according to claim 1, wherein the plurality of fourth conductors are repeatedly arrayed.

10. The interconnect board according to claim 9, wherein the fourth conductors are located on a layer different from the first layer, and are connected to the first conductors through a connection member.

11. The interconnect board according to claim 1, wherein the fourth conductors are located on a layer different from the first layer, and are connected to the first conductors through a connection member.

12. The interconnect board according to claims 1, wherein the fourth conductors are located on the first layer, and the fourth conductors connected to one of the first conductors and the fourth conductors connected to the other first conductors are alternately arrayed in the gap.

13. The interconnect board according to claims 1, wherein the fourth conductors are located on the first layer, and recess portions are formed in the other first conductors, and the fourth conductors are inserted into the recess portions in the gap.

14. The interconnect board according to claims 1, wherein the third conductors are located between the first layer and the second layer, face the first conductors and the second conductors, and are connected to any one of the first conductors and the second conductors which face each other through a third connection member.

15. The interconnect board according to claim 1, wherein the third conductors face the second conductors through the first conductors, and are connected to the facing second conductors through the third connection member, and
the first conductors or the second conductors are provided with an opening through which the third connection member passes.

16. The interconnect board according to claim 1, wherein the third conductors face the first conductors through the second conductors, and are connected to the facing first conductors through the third connection member, and
the third conductors are provided with an opening through which the third connection member passes.

17. The interconnect board according to claim 1, wherein the third conductors are located on the first layer, face the second conductors, and are connected to the first conductors through an inductor.

18. The interconnect board according to claim 1, wherein the third conductors are located on the second layer, face the first conductors, and are connected to the second conductors through an inductor.

19. The interconnect board according to claim 1, wherein the first conductors are power supply planes, and the second conductors are ground planes.

20. An electronic apparatus comprising:
an electronic device;
a plurality of first conductors that are located on a first layer and are disposed with a gap therebetween;
a first connection member that connects at least one of the plurality of first conductors with the electronic device;
a second conductor that is located on a second layer and faces the plurality of first conductors;
a second connection member that connects the second conductor with the electronic device;
a plurality of third conductors that is repeatedly arrayed so as to surround an area including a connection point of the first connection member and the first conductors or a connection point of the second connection member and the second conductor and at least some of the gap in a planar view; and
fourth linear conductors that are formed at locations in which the fourth linear conductors overlap the gap included in the area in a planar view, and of which one ends are connected to one of the first conductors, and the other ends are open ends, wherein at least some of the fourth conductors face the first conductors which are not in contact with the fourth conductors.

* * * * *